US007838085B2

(12) United States Patent
Boardman et al.

(10) Patent No.: US 7,838,085 B2
(45) Date of Patent: Nov. 23, 2010

(54) METHOD FOR DIRECTING PLASMA FLOW TO COAT INTERNAL PASSAGEWAYS (75) Inventors: William John Boardman, Colorado Springs, CO (US); Raul Donate Mercado, Danville, CA (US); Andrew William Tudhope, Danville, CA (US)

(73) Assignee: Sub-One Technology, Inc., Pleasanton, CA (US)

( * ) Notice: Subject to any disclaimer, the term of this patent is extended or adjusted under 35 U.S.C. 154(b) by 88 days.

(21) Appl. No.: 12/252,846

(22) Filed: Oct. 16, 2008

(65) Prior Publication Data
US 2009/0035483 A1 Feb. 5, 2009

Related U.S. Application Data (62) Division of application No. 10/850,474, filed on May 19, 2004, now Pat. No. 7,444,955.

(51) Int. Cl.
H05H 1/24 (2006.01)
(52) U.S. Cl. .................... 427/569; 427/457; 427/230; 427/237; 427/238; 118/723 R; 118/723 E; 118/723 ER; 204/192.1
(58) Field of Classification Search ................ 427/457, 427/569, 230, 237, 238; 204/192.1, 192.11, 204/192.12, 192.13, 192.14, 192.15, 192.16, 204/192.38; 118/723 R, 723 E, 723 ER
See application file for complete search history.

(56) References Cited

U.S. PATENT DOCUMENTS

| 4,529,427 | A |  | 7/1985 | French |
| 5,026,466 | A |  | 6/1991 | Wesemeyer et al. |
| 5,261,963 | A |  | 11/1993 | Basta et al. |
| 5,298,137 | A |  | 3/1994 | Marshall, III |
| 5,435,900 | A |  | 7/1995 | Gorokhovsky |
| 5,439,525 | A |  | 8/1995 | Peichl et al. |
| 5,514,276 | A |  | 5/1996 | Babcock et al. |
| 5,716,500 | A |  | 2/1998 | Bardos et al. |
| 5,733,418 | A |  | 3/1998 | Hershcovitch et al. |
| 5,869,133 | A |  | 2/1999 | Anthony et al. |
| 5,882,488 | A | * | 3/1999 | Leiphart ................ 204/192.32 |
| 6,129,856 | A |  | 10/2000 | Jung et al. |
| 6,391,394 | B1 |  | 5/2002 | Shirasuna et al. |
| 6,436,252 | B1 |  | 8/2002 | Tzatzov et al. |

(Continued)

FOREIGN PATENT DOCUMENTS

JP      62-180064 A      8/1987

(Continued)

Primary Examiner—Timothy H Meeks
Assistant Examiner—Collette Ripple
(74) Attorney, Agent, or Firm—Schneck & Schneck (57) ABSTRACT An apparatus for coating surfaces of a workpiece configured to establish a pressure gradient within internal passageways through the workpiece, so that the coating within the internal passageways exhibits intended characteristics, such as those relating to smoothness or hardness. The coating apparatus may include any or all of a number of cooperative systems, including a plasma generation system, a manipulable workpiece support system, an ionization excitation system configured to increase ionization within or around the workpiece, a biasing system for applying a selected voltage pattern to the workpiece, and a two-chamber system that enables the plasma generation to take place at a first selected pressure and the deposition to occur at a second selected pressure.

16 Claims, 5 Drawing Sheets

U.S. PATENT DOCUMENTS

| | | |
|---|---|---|
| 6,488,825 B1 | 12/2002 | Hilliard |
| 6,649,223 B2 | 11/2003 | Colpo et al. |
| 6,663,755 B2 | 12/2003 | Gorokhovsky |
| 7,068,899 B2 | 6/2006 | Milicevic et al. |
| 7,444,955 B2 | 11/2008 | Boardman et al. |
| 2002/0170495 A1 * | 11/2002 | Nakamura et al. .......... 118/715 |

FOREIGN PATENT DOCUMENTS

| | | |
|---|---|---|
| JP | 63-26373 A | 2/1988 |
| JP | 2001-200369 A | 7/2001 |

* cited by examiner

FIG.6

METHOD FOR DIRECTING PLASMA FLOW TO COAT INTERNAL PASSAGEWAYS

CROSS-REFERENCE TO RELATED APPLICATION

This is a divisional of pending U.S. patent application Ser. No. 10/850,474 filed May 19, 2004.

TECHNICAL FIELD

The invention relates generally to deposition systems and more particularly to apparatus for coating internal passageways of a workpiece.

BACKGROUND ART

During the design and manufacture of components of systems that are to be used within particular industries, important concerns include surface smoothness, hardness, cost and environmental effects of fabrication techniques. As one example, the semiconductor fabrication industry utilizes ultra high purity gas delivery systems in which these concerns are considered in the selection of techniques for manufacturing the system components. Such system components include mass flow controllers, valves, pressure regulators, purifiers, filters and tubing. In the semiconductor industry, corrosion resistance in a gas delivery system is critical to achieving and maintaining a contaminant-free environment. Smoothness plays an important role in controlling turbulence and minimizing moisture-inducing conditions. There are detailed, strict specifications on the cleanliness, smoothness and hardness of materials used in manufacturing components of gas delivery systems, as specified by organizations such as Semiconductor Equipment and Materials International (SEMI). Other industries in which the concerns are important factors include those of the medical and aerospace fields.

Many gas delivery components must meet a Vickers hardness of 300, which is a standard intended to ensure that metal surfaces will not generate scratches upon meeting with each other. Scratching is an issue, since it leads to the generation of particulates. Materials that are selected because they satisfy other requirements may not meet this standard and, therefore, are subjected to elaborate post-manufacturing techniques designed to increase hardness. For example, 316L stainless steel, which is an austenitic alloy made of iron, chromium, nickel and other trace materials, does not intrinsically meet the 300 Vickers hardness requirement until the component is burnished. Unfortunately, burnishing is time-intensive and significantly affects the yield of a manufacturing batch of the components.

One approach to collectively addressing the concerns is to select a base material for certain properties and then coat the base material following shaping of the component. Typically, the coating material is either a metal or a metal-containing compound (such as a ceramic). Coating techniques include chemical vapor deposition (CVD), physical vapor deposition (PVD), plasma spray, electroplating, and sol-gel. For CVD, a gaseous species that includes the coating material may be introduced into a vacuum chamber, so that when the gas is decomposed in the chamber, the coating material is deposited upon the component (i.e., the "workpiece"). In comparison, PVD is a thin film deposition process in the gas phase, wherein the coating material is physically transferred into the vacuum without any chemical reactions. That is, there is no change in chemical composition of the coating material. PVD may be performed by evaporating a target of coating material in vacuum using heating, an ion beam, cathodic arc, or an electron beam. The cathodic arc process may employ a magnetic field to confine an arc having a high current density to the area of the target. By using the magnetic field to steer the arc, a greater portion of the target may be used before replacement is required.

The PVD process offers improved safety and environment conditions, as compared to the typical CVD process, when depositing a metal or metal-containing film, such as titanium, titanium nitride, chromium, and chromium nitride. PVD typically operates in the range of 1 mTorr to 10 mTorr. This is accomplished by using magnetic confinement of the plasma electrons near the cathode, the so called "sputter magnetron," to enhance the plasma at low pressures. Non-magnetron forms of sputtering can be operated at higher pressures, for example diode sputtering, which can operate up to 1 Torr. In comparison, CVD pressures may be in the range of 50 mTorr to atmospheric, with low pressure CVD (LPCVD) typically being between 100 mTorr and 1 Torr. However, other process reasons may dictate the use of LPCVD. For example, the LPCVD approach may be selected over the PVD process for purposes of reducing the mean free pass and the directionality of gas flows. This may be important for applications in which the workpiece to be coated is one that has a complex geometry.

Coating a workpiece can be particularly problematic when the workpiece includes internal passages, such as those found in valves, pressure regulators, and tubes. As the complexity of the geometry of the workpiece increases, there is a decrease in the ability to select a coating process on the basis of maximizing environmental and human safety. U.S. Pat. No. 5,026,466 to Wesemeyer et al. describes a solution which may be used in a limited number of applications for coating internal passageways. In Wesemeyer et al., the cathode (i.e., the target formed of the coating material) is positioned within the cavity of the workpiece. For example, when the workpiece is a tube, the cathode is positioned within the internal passageway through the tube. In operation, the material from the cathode surface is evaporated and is deposited on the internal surface of the workpiece. Optionally, the workpiece is connected as the anode. That is, a negative voltage may be applied to the workpiece so as to provide the condition for inducing evaporation of material from the cathode located within the workpiece.

While the Wesemeyer et al. patent and patents to Gorokhovsky (U.S. Pat. Nos. 5,435,900 and 6,663,755) describe coating apparatus that perform well in various applications, performance factors such as coating uniformity may be significantly affected when the workpiece is geometrically complex.

SUMMARY OF THE INVENTION

An apparatus for coating surfaces of a workpiece having at least one internal passageway includes a plasma source for generating a plasma which includes the coating material, a support to secure a workpiece in a specific orientation in spaced apart relationship with respect to the plasma source, and a plasma flow system to direct a controlled flow of the plasma through each internal passageway of the secured workpiece. The apparatus may include a particular combination of various subsystems, such as the plasma generation system, the workpiece support system, the plasma flow system, an ionization excitation system configured to increase ionization within or around the workpiece, a biasing system for applying a selected voltage pattern to the workpiece, and a two-chamber system that enables the plasma generation to take place at a first selected pressure and the deposition to occur at a second selected pressure.

For uniform coating of internal passageways, it is important to avoid the molecular flow region. That is, the size of the internal diameter of the passageway should be greater than the length of the ion (or atom) mean free path. Continuum flow is desired where the internal diameter is greater than one hundred times the mean free path.

The workpiece support system is configured to provide plasma flow through the internal passageways of the workpiece. A pressure gradient is established within the workpiece. The workpiece is secured such that each opening of the workpiece is either an evacuation port or an entrance port for the plasma. A flow control member, such as a throttle valve, may be adjusted to balance the flow rate and pressure gradient through the workpiece. The voltage biasing system may apply a negative pulse bias having a particular duty cycle which is selected to allow ions to be replenished between periods of attracting the ionized coating material to the surfaces of the workpiece. The magnitude of the bias can be adjusted to control the arrival angle of the ions with respect to the surfaces of the workpiece, allowing coatings of geometric shapes having high aspect ratio features.

For embodiments that include the two-chamber system, the apparatus may be one that uses physical vapor deposition (PVD) with a source chamber kept at a relatively low pressure and a deposition chamber maintained at a higher pressure. It is desirable to use PVD for metal sources, as compared to CVD, due to safety and environmental concerns. PVD techniques may be employed without use of a two-chamber system by selecting diode sputtering.

The high-pressure deposition chamber may have smaller dimensions as compared to the low pressure source chamber. The two chambers may be coupled by a necked down (or constriction) area which is biased to repel ions and prevent buildup of film. This constriction helps prevent backflow from the higher pressure chamber into the source chamber. A gas, such as argon, can be introduced to provide the increased pressure. As another possibility, a pair of low pressure source chambers may be provided, so that the two sources cooperate in feeding the high pressure deposition chamber.

Any plasma will contain various ratios of ions to non-ionized gas atoms or molecules. Ionization can range from 0.1% to 100%. In general, higher ionization leads to more conformal coatings. The increase in pressure from the source chamber to the deposition chamber may cause a loss of ionization. A solution is to provide an ionization excitation system to increase ionization within or near the workpiece. As one possible embodiment of such a system, a microwave source may be used to provide high ionization around the workpiece. Alternatively, plasma sources such as electron cyclotron resonance (ECR), distributed ECR, and radio frequency (RF) sources, may be employed to increase ionization.

A preferred approach to achieving a target level of ionization, where an increase is desired, is to generate a plasma within the internal passageway itself, using the passageway of the workpiece as a hollow cathode. Anytime the plasma is generated external to the workpiece, there is some decrease of ionization as the ions and atoms flow from the entrance toward the exit. Potentially, this causes a non-uniformity in the coating film along the length of the internal passageway, with the coating thickness at the exit approaching zero as the passageway length increases and as the passageway diameter decreases. By using plasma generation throughout the length of the passageway (via the hollow cathode approach), a uniform coating can be achieved, even in the case of very long passageways.

An advantage of the invention is that the coating apparatus allows a manufacturer to provide an end product which offers the benefits of a metallic exterior, such as corrosion resistance and high vacuum integrity, while allowing the use of a less expensive base material, such as a plastic. The metallic coating then serves as a functional, protective barrier to the base material. Another advantage of the invention is that an increase in coating uniformity can be achieved.

DETAILED DESCRIPTION

Figure 1:
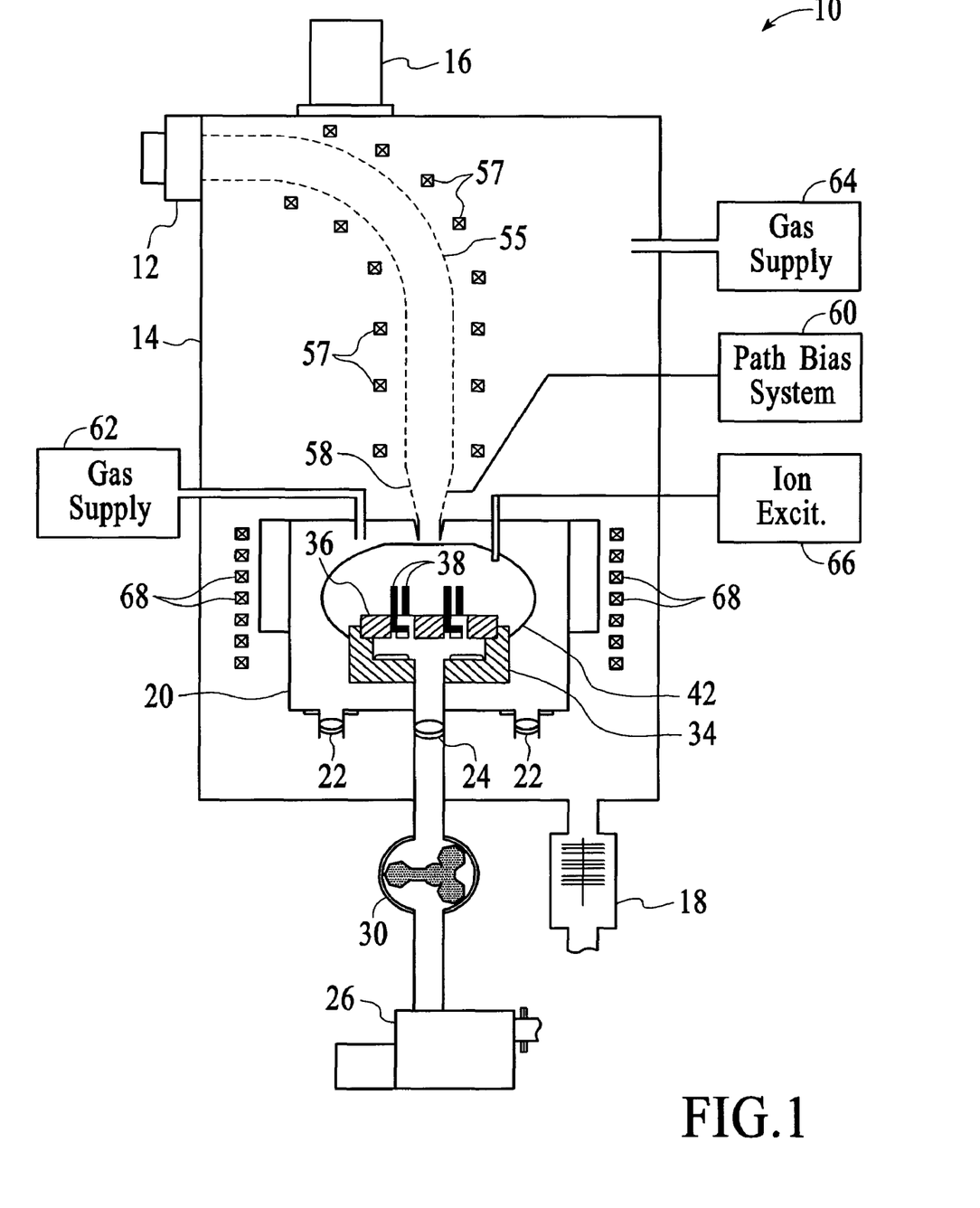
FIG. 1 is a functional view of a coating apparatus according to one embodiment of the present invention.

With reference to FIG. 1, one embodiment of a coating apparatus 10 is illustrated as including a plasma generation system, a workpiece support system, a plasma flow system, an ionization excitation system, and a two-chamber system. Moreover, a workpiece biasing system is included, as will be described with reference to FIG. 2. However, other embodiments of a coating apparatus in accordance with the invention may have only a subset of the different systems. For example, the embodiment of FIG. 6 does not include the two-chamber system, since it utilizes the advantageous mode of diode sputtering. A common feature of the different embodiments is that ionized plasma flows through at least one internal passageway of a workpiece to be coated.

The coating apparatus 10 includes a plasma source 12. While other techniques may be used (e.g., CVD), PVD is preferred for reasons that were previously stated. Cathodic arc techniques provide a highly ionized source plasma (which can approach 100% ionization), with a small amount of background gas (reactive or inert) having lower ionization being introduced. Alternatively, the background gas can be ionized and can include neutral source atoms, as in many of the various known sputtering approaches. The selection of settings for different operational parameters will vary in dependence upon the selection of techniques, but again the common feature is the "flow-through" feature.

The plasma source 12 is associated with a relatively low pressure source chamber 14. The pressure within this chamber may be maintained using a high vacuum pump 16 and a turbo pump 18. By way of example, the pressure within the chamber 14 may be within the range of 1 mTorr to 10 mTorr, where the plasma source is the preferred PVD source. In comparison, a CVD source would require a significantly higher pressure, such as 50 mTorr.

Figure 6:
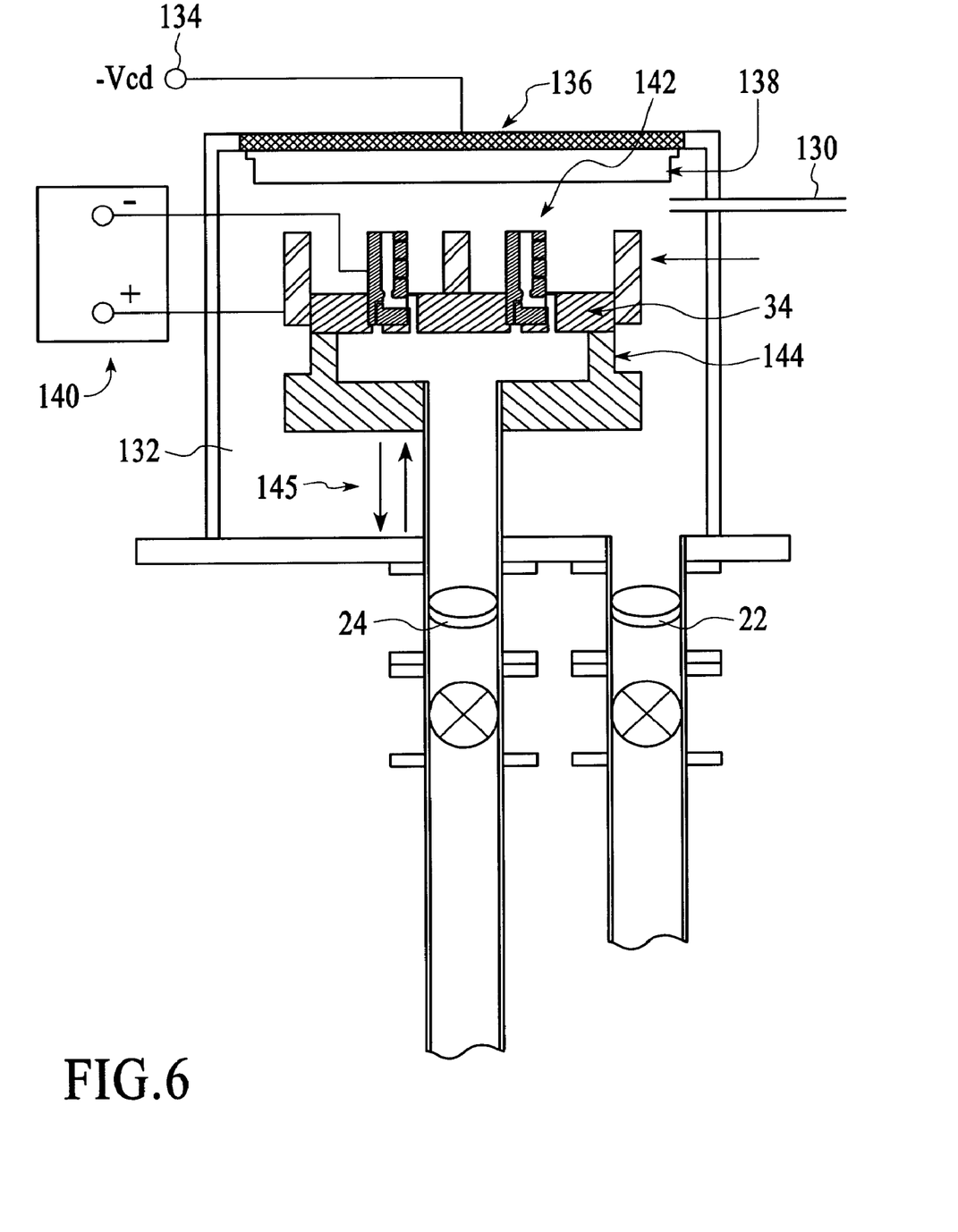
FIG. 6 is a side view of a third embodiment using diode sputtering in accordance with the invention.

In addition to the low pressure source chamber 14, there is a high pressure deposition chamber 20. The pressure difference between the two chambers is maintained by the combination of a second vacuum pump 26 and a blower 30, with pressure control valves 22 and 24 enabling pressure regulation. An acceptable pressure range for the deposition chamber 20 is 50 mTorr to 1 Torr. Where the desired pressure is closer to the 1 Torr end of this range, the one-chamber, diode sputtering embodiment of FIG. 6 is particularly well suited.

Mounted within the deposition chamber 20 is the workpiece support system, which includes a support member 34. In this embodiment, the support system also includes a fastening member 36 having four vertical projections 38 that secure a workpiece to the support member 34. Alternatively, the fastening member 36 and its vertical projections may be considered to be the workpiece in FIG. 1. Whether considered to be a part of the workpiece support system or to be the workpiece itself, this component includes passageways that allow flow between the deposition chamber 20 and the pump 26.

Figure 2:
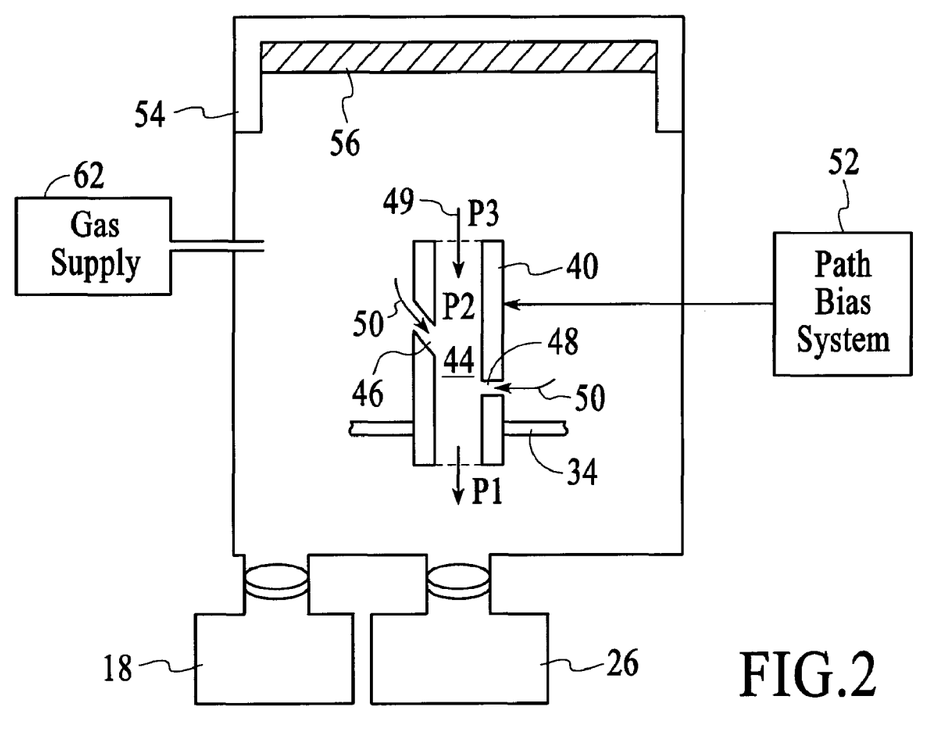
FIG. 2 is a side view of a workpiece secured within a simplified view of a deposition chamber in which plasma flow is through the various internal surfaces of the workpiece.
Figure 3:
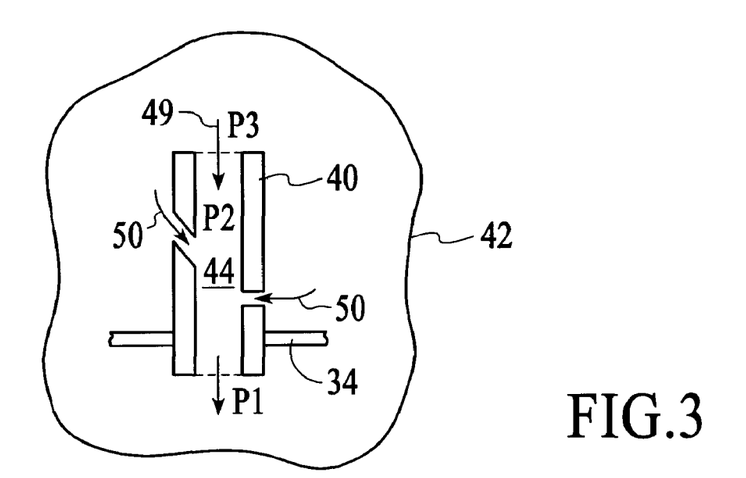
FIG. 3 is an illustration of the workpiece of FIG. 2 within a plasma.

Referring now to FIGS. 1, 2 and 3, important to the invention is that a workpiece 40 is supported so as to allow gas flow to be directed through the workpiece. Thus, as indicated by the arrows in FIGS. 2 and 3, at least one internal passageway of the workpiece is positioned such that an opening is aligned with the flow to the vacuum pump 26, while the other openings are exposed to the plasma environment (42 in FIGS. 1 and 3). As can be seen, the exterior surfaces will be coated at the same time as the interior surfaces. A pressure gradient is created as a consequence of the low pressure maintained by the vacuum pump 26 and the higher pressure maintained in the deposition chamber 20 by a background gas from a gas supply 62. The pressure gradient directs the plasma flow through the internal passageways of the workpiece, allowing the internal surfaces to be coated. The gradient can be balanced and adjusted using the pressure control valves 22 and 24 and using available adjustments of the vacuum pumps 16, 18 and 26 and/or adjustments of the background gas flow rate.

Three pressure regions (P1, P2 and P3) are shown in FIGS. 2 and 3, where P3>P2>P1. P1 is a very low pressure generated by the pump 16, which may be a mechanical pump generating a base pressure of approximately 10 mTorr (although lower base pressures are possible if a high vacuum pump is used). The pressure difference between P1 and P3 drives the flow through the internal passageway 44 toward the vacuum pump 26, as indicated by the arrow 49, while the pressure difference between P2 and P3 drives the flow through internal passageways 46 and 48 toward the vacuum pump 26, as indicated by arrows 50. This pressure gradient controls the velocity of flow toward the openings of the workpiece 40 and through the internal passageways. The diameters of the internal passageways also affect the pressure gradient, but this is a constant that is selected by the design of the workpiece. In order to compensate for differences in dimensions of different workpieces, the position of the throttle valve 24 may be adjusted to set P1 and/or the gas flow rate and the position of the throttle valve 22 may be adjusted to set P3. As an alternative to the workpiece support system of FIGS. 1-3, the support member 34 of FIGS. 2 and 3 can be placed at the top of the workpiece, so that all flow will enter the main opening at pressure P3 and exit through the other three openings at pump pressure P1.

In FIG. 2, a workpiece (part) bias system 52 is included. The bias system applies a voltage having a polarity that is the opposite of the ions within the plasma. The bias may be continuous, but is preferably applied in pulses having a duty cycle that can be adjusted to allow the ions to be replenished within the plasma 42 and particularly within the plasma of the passageways 44, 46 and 48. The upper limit of the magnitude is at least partially based upon the level of ionization within the plasma. For applications in which implementation of the coating material is to take place below the surface, high voltages should be applied, such as −25 kV to −100 kV. An example of a situation in which implantation is to take place below the surface is the nitridation of steel. In comparison, for those applications in which a top film is to be deposited and applications in which internal passageways of the workpiece have a high aspect ratio, lower voltages should be used. The lower voltage magnitudes reduce the possibility of losing the plasma inside the workpiece 40 as a result of an increase in the size of the plasma sheath. The loss of plasma would negatively impact the uniformity of the coating. Regarding the high aspect ratio applications, the lower voltages will result in smaller arrival angles of the incoming ions, improving coating performance. Acceptable voltages in the applications of coating of small internal diameters may range from −50V to −2 kV. Thus, there is a tradeoff between increasing deposition rates by applying relatively high biasing and achieving the highest quality and most uniform coating.

The duty cycle and magnitude of the voltage pattern from the bias system 52 will have an effect on re-sputtering, particularly when coating small diameter tubes having a high aspect ratio. In general, duty cycles between one percent and seventy-five percent should be used for such applications. Within this general range, the optimal duty cycle will vary in dependence upon the magnitude of the bias and upon the chamber pressurization.

In FIG. 2, an anode 54 and a cathode 56 are illustrated. Operations and conditions for cathodic arc, sputter magnetron, and other plasma generators are known in the art and will not be explained herein.

Figure 4:
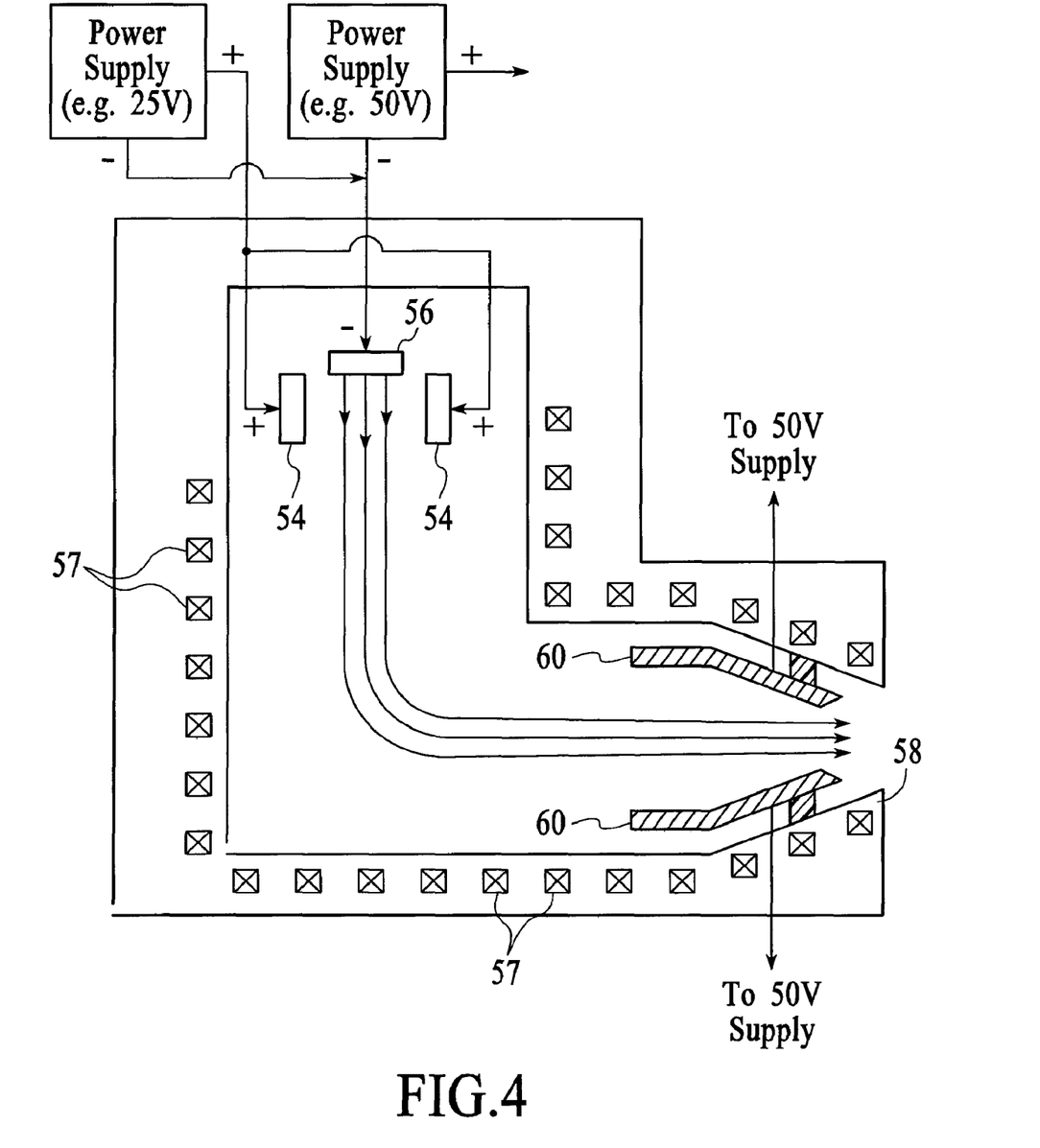
FIG. 4 is a side view of a representation of a constricted area in accordance with the invention.

In the two-chamber system of FIG. 1, there is a magnetic steering region 55 from the plasma source 12 to the deposition chamber 20. The magnetic steering region may be considered to be part of the plasma flow control system. Fixed magnetic members 57 may be carefully positioned or an electromagnetic means may be employed. One of the benefits of the magnetic steering region is that particles generated at the source 12 are filtered from the plasma stream that reaches the deposition chamber 20. FIG. 4 also shows a magnetic steering region, but with a different orientation. The same reference numerals will be used for the equivalent components of FIGS. 1 and 4. While the magnetic steering region will be described with respect to the two-chamber embodiment of FIG. 1, a comparable region may be used in the one-chamber embodiment of FIG. 6 or in the two-source embodiment of FIG. 5.

One of the factors that define the overall pressure gradient is the geometry of a "necked down" (or constriction) port 58. Preferably, this port is biased using a path bias system 60 which provides a voltage having a polarity opposite of that of the part bias system 52 described with reference to FIG. 2. Biasing of the port may be used to repel ions and prevent buildup of film in undesirable locations. This constriction from the source chamber to the deposition chamber reduces the conductance between the chambers and, in combination with both the gas flow injected into chamber 20 and the adjustable difference in pumping speeds for the two chambers, allows a higher pressure in the deposition chamber 20.

As previously noted, a gas supply 62 may be connected to the deposition chamber to provide an adjustable background gas flow rate. In FIG. 1, a second gas supply 64 is shown as being coupled to the source chamber 14, but its purpose is not to equalize the pressure between the two chambers. The gas that is introduced may be an inert gas, such as argon, or a reactive gas as used in reactive sputtering. However, care must be taken in not diluting the source gas to the extent that the deposition rate drops to an undesirable level.

An issue with the increase in pressures of the two chambers 14 and 20 is that the plasma will begin to lose ionization. That is, as pressure increases, ionization is reduced. A high ionization is needed for plasma immersion ion implantation deposition (PIIID). Thus, an ion excitation system 66 may be included with the coating apparatus 10 of FIG. 1. In one implementation, the ion excitation system is a microwave source for increasing ionization around or within the workpiece. Alternatively, other plasma sources may be used, such as RF excitation, or ECR or DECR sources. Where the increased ionization occurs inside the workpiece, the implementation may be considered to be a "hollow cathode." The higher pressure regime within the deposition chamber 20 will cause the gas flow to be much less directional, due to the shorter mean free paths. As a result, there will be an increase in collisions. In the case in which it is desirable to coat the internal surfaces of a complexly shaped workpiece, this provides the ability to direct the gas flow through the internal passageways of the workpiece by the use of the pressure gradient that was described above. This itself causes a pressure differential, depending on the size of the workpiece.

When considering the flow rates and pressures required through the workpiece 40, if the internal section is approximated to be the internal section of a long circular tube with laminar flow, Poisuille's equation can be used:

$$\frac{Q}{P_1 - P_2} = \frac{\pi d^4 P}{\eta l}$$

where Q is the throughput or pressure times the volumetric flow rate, d is the passageway diameter, P is the average pressure ($(P_1+P_2)/2$), l is the passageway length, $\eta$ is the viscosity, $P_1$ is the pressure at the workpiece opening to the deposition chamber, and $P_2$ is the pressure at the workpiece opening to the pump. As the pressure gradient is increased by opening the throttle valve to the pump 26 (reducing $P_2$), Q will increase and the pressure in the interior passageway of the workpiece will drop. If the pressure gradient is further increased, Q will continue to increase until it reaches a maximum at which the gas is flowing at the speed of sound. When Q reaches its maximum, the equation no longer applies and the condition is referred to as "choked" or "critical" flow. In the equation, d is raised to the fourth power and will have a very significant effect on Q and pressure gradient. This is the reason for providing an adjustable alternative pumping path to the deposition chamber, effectively providing an alternative larger value of d.

Inside the workpiece, it is desirable to maintain laminar flow and avoid molecular flow if uniform coating is to be achieved. To avoid the directionality of typical low pressure cathodic arc or sputtering, higher pressure deposition (50 mTorr to 1 Torr) should be used. For laminar flow, the Knudson number, Kn<0.01, and Reynolds number Rn<1200, may be used, where Kn=$\lambda$/d, where $\lambda$=mean free path of ions or atoms, Rn=4 m/(kT$\pi\eta$)×(Q/d), where Q is the "throughput in" Pa-L/s, k=boltzmans constant and $\eta$ is the viscosity. The Knudson number shows the transition from the molecular flow regime (Kn<1) to the viscous or turbulent flow regime. For a 1 cm diameter tube, flow will move out of molecular flow into transition region flow at $\lambda$<1 cm. For $N_2$, this corresponds to a pressure of 0.8 Pa (6 mTorr), and the flow will be fully viscous (if Rn<1200) at $\lambda$=0.01 cm, which for $N_2$ corresponds to a pressure of 65 Pa (488 mTorr).

While the workpiece support system is shown as being stationary within the deposition chamber 20, it is possible to provide a workpiece support member 34 that can be moved either or both of horizontally and vertically, thereby promoting coating uniformity. As another possibility, the support member rotates about a vertical axis, which may be helpful for coating certain types of workpieces having complex geometries.

Figure 5:
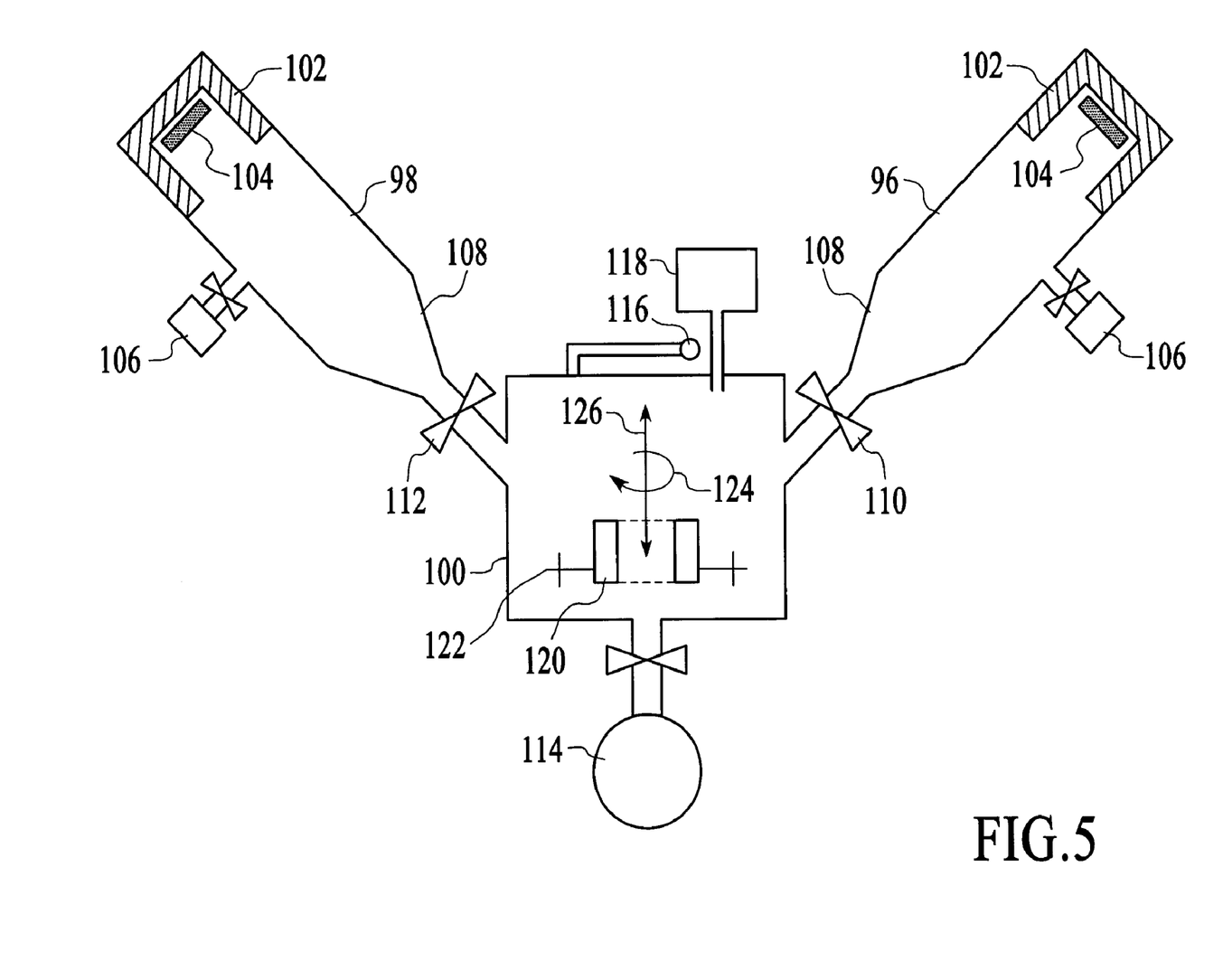
FIG. 5 is a side view of an embodiment of the invention having two source chambers which simultaneously supply plasma to a single deposition chamber.

A second embodiment is shown in FIG. 5. In this embodiment, there are two source chambers 96 and 98 that supply a single deposition chamber 100. The two source chambers are identical. Each source chamber includes an anode 102, a cathode 104, a pumping arrangement 106 and a "necked down" region 108.

The passages from the source chambers 96 and 98 to the deposition chamber 100 are controlled by throttle valves 110 and 112. While not shown, the necked down regions 108 are preferably biased to prevent buildup of coating material. Another element of the pressure-control system is the throttle-controlled pumping arrangement 114 of the deposition chamber.

In FIG. 5, the deposition chamber 100 is connected to an ion excitation system 116 and to a gas source 118. As described above, the ionization excitation system may be a microwave source or a plasma source, such as one that utilizes ECR, distributed ECR, or RF techniques. The gas source 118 may provide an inert gas, such as argon or may be a reactive gas.

Within the deposition chamber 100 is a workpiece 120 that is secured in position by a workpiece support system 122. The workpiece support system enables rotation of the workpiece (as indicated by the curvature of line 124) and enables upward and downward movement of the workpiece (as indicated by line 126). Preferably, the workpiece is also movable in the horizontal directions.

In operation, the throttle valves 110 and 112 regulate the flow of plasma from the two source chambers 96 and 98 into the single deposition chamber 100. The gas supply 118 may function as a third gas inlet to the chamber. The exhaust from the chamber is determined by the throttle-controlled pumping arrangement 114. The workpiece 120 is secured such that a pressure gradient is established through the internal passageway or passageways of the workpiece. The workpiece support system 122 is enabled to move the workpiece vertically and horizontally and is able to rotate the workpiece. Optionally, the embodiment also includes a magnetic manipulation system in which the coating process is raster scanned by continuously changing the magnetic field within the plasma in and around the workpiece. This aspect of changing the magnetic field to localize the coating process may be used in embodiments that do not include coating internal passageways of a workpiece. For example, the magnetic field within a plasma surrounding a semiconductor substrate may be manipulated in order to ensure proper step coverage at trenches along the surface of the semi-conductor substrate. The magnetic field manipulation is particularly effective when combined with the ability to linearly and/or rotationally reposition the workpiece within the deposition chamber.

A third embodiment of the invention is shown in FIG. 6. This embodiment utilizes a PVD method capable of operating at higher pressures (20 mTorr to 1 Torr), such as diode sputtering. As a consequence, only a single chamber is required, thereby providing a simplification as compared to the previously described embodiments. As before, an inert or reactive background gas can be introduced via a gas manifold inlet 130. The introduction of background gas is intended to bring the deposition chamber 132 to the required pressure for continuum flow and the effective use of the flow-through technique. The workpiece support member 34 and the throttle valves 22 and 24 are functionally identical to those of the embodiment of FIG. 1, so that the same reference numerals are employed. The workpiece support member is formed of an insulator material and is configured to ensure that the flow is through the workpiece. The adjustments of the throttle valves 22 and 24 and the adjustment of the flow rate of background gas determine the pressure gradient through the workpiece.

A negative bias 134 is applied to the cathode 136, while the anode 138 is placed at ground potential. The negative bias may be a fixed potential or may be a pulsed signal. Due to the higher pressures used in diode sputtering, higher bias voltages are often required, such as voltages greater than 3 kV. This is due to the fact that the mean free path of the ions accelerating through the plasma sheath may become less than the thickness of the sheath, resulting in collisions and loss of energy. The increased voltage compensates for this energy loss. However, water cooling of the cathode may be necessitated. The cathode may consist of an elemental metal, such as titanium or chromium, or may be a metal alloy.

As is known to persons skilled in the art of sputtering, the voltage potential across the anode 138 and cathode 136 will ionize the background gas and ions will be accelerated into the cathode. As a consequence, metal atoms will be transferred to the gas stream by the momentum transfer. The pressure gradient draws the gas stream through the workpiece.

The gas stream contains the coating material, such as chromium. Due to the reactive nature of the metal ions, the coating material tends to adhere to the portions of the workpiece closest to the cathode, while less coating is deposited at the portion of the workpiece closest to the pump. The embodiment of FIG. 6 overcomes this tendency toward nonuniformity of deposition by using a separate pulsed power supply 140 to negatively bias the workpiece. If the background gas is $Ar^+$, the $Ar^+$ will be accelerated across the plasma sheath and will cause re-sputtering of the coating material back into the gas stream, in addition to improving film properties. The velocity of the gas stream is directed toward the pump end of the workpiece, due to the pressure gradient. This velocity will carry the atoms of coating material toward the pump end. The process is repeated down the length of the tube, resulting in uniform deposition if the $Ar^+$ maintains ionization throughout the length of the internal passageway of the workpiece. The ratio of deposition/re-sputtering can be controlled by adjusting the duty cycle and magnitude of the negative bias applied to the part by the power supply 140. Adjustments of the duty cycle and magnitude also vary the deposition rate.

Another aspect of the invention is the use of a hollow cathode to maintain ionization within the workpiece. This technique requires that the mean free path of an electron is less than the diameter of the workpiece internal passageway. Under this condition, the electron will oscillate between the walls of the passageway upon application of the negative bias by the power supply 140. The oscillation will result in multiple ionization collisions and will create plasma within the internal passageway. When coating a workpiece with multiple internal passageways with varying internal diameters, the process pressure is adjusted such that the electron mean free path is just slightly less than the smallest diameter passageway, so that all passageways will have plasma internally generated and all large passageways will maintain the plasma. If $\lambda/d=1$ is set as a requirement for an internal hollow cathode plasma, where $\lambda$ is the mean free path of the electron and d is the smallest internal tube diameter, then as the diameter becomes smaller, the pressure will increase (to decrease $\lambda$). Thus, the operating pressure will be tuned to generate a plasma in this smallest internal spacing of the workpiece, or set of workpieces, being coated. The tuning can be achieved by adjustments of the throttle valves 22 and 24 and/or adjustments of the gas flow rate through the inlet 130.

At the operating pressures required for use of an internal hollow cathode and the use of the flow-through techniques, the spacing between the cathode and a workpiece 142 being coated (and the anode 138) is significant. The decreased mean free path of the sputtered atoms will increase backsputtering of the atoms to the cathode and loss to the walls of the deposition chamber 132. This requires closer spacing to the cathode, so that the flow-through pressure gradient will pull the sputter atoms into the workpiece before they are lost. In practice, there is a balance between this requirement for close spacing and the concern that arcing or nonuniform sputtering will occur as a result of the close spacing. The embodiment of FIG. 4 includes a vertically adjustable platform 144 that enables adjustment of the spacing, as indicated by arrows 145.

What is claimed is:

1. A method for coating surfaces of a workpiece having at least one internal passageway comprising:
    generating a plasma at a plasma source such that said plasma includes ions of a coating material to be deposited on said surfaces of said workpiece;
    securing said workpiece using a support configured such that said workpiece has a specific orientation in spaced apart relationship with respect to said plasma source;
    directing a controlled flow of said plasma having said ions from said plasma source into each said internal passageway and exhausting said plasma from, said workpiece while said workpiece is secured to said support; and
    increasing ionization of said plasma that is within said workpiece by applying hollow cathode techniques, including biasing said workpiece and tuning pressure to induce oscillation of electrons of said plasma within said workpiece.

2. The method of claim 1 wherein tuning said pressure includes determining an operating pressure on a basis of diameter of said at least one internal passageway of said workpiece.

3. The method of claim 1 wherein biasing said workpiece includes applying a pulsed negative bias.

4. The method of claim 3 wherein
    applying said pulsed negative bias includes selecting a duty cycle at least partially upon allowing said ions of said coating material to be replenished between periods in which a negative voltage is applied to said workpiece.

5. The method of claim 3 further comprising adjusting at least one of a duty cycle and a magnitude of said pulsed negative bias to provide changes in coating characteristics during deposition of said coating material onto said surfaces of said workpiece.

6. The method of claim 3 wherein applying said pulsed negative bias includes selecting a magnitude which causes re-sputtering of said coating material that is initially deposited at an upstream end of said at least one internal passageway, thereby enabling redeposition downstream of said upstream end.

7. The method of claim 1 wherein applying said hollow cathode techniques includes tuning said pressure such that an electron mean free path is equal to or less than a minimum internal diameter of said at least one internal passageway, such that application of a negative bias to said workpiece establishes a hollow cathode effect in which ionization occurs.

8. A method for coating an internal passageway of a workpiece comprising:

generating a plasma at a plasma source such that said plasma includes ions of a coating material to be deposited on a surface of said internal passageway;

directing a controlled flow of said plasma from said plasma source into said internal passageway of said workpiece and exhausting said plasma from said internal passageway; and increasing ionization of said plasma that is within said internal passageway by applying hollow cathode techniques, including biasing said workpiece and tuning pressure within said internal passageway to induce oscillation of electrons of said plasma within said internal passageway.

9. The method of claim 8 wherein tuning said pressure within said internal passageway includes establishing a relationship between said pressure and a diameter of said internal passageway so as to achieve a hollow cathode effect.

10. The method of claim 9 wherein biasing said workpiece includes applying a negative pulsed voltage.

11. The method of claim 10 wherein a magnitude of said negative pulsed voltage is at least partially selected on a basis of achieving a level of ionization within said plasma in said internal passageway.

12. The method of claim 8 further comprising fixing said workpiece in position using a support.

13. A method of coating an internal passageway of a workpiece comprising:

forming a plasma at a source that is external to said workpiece, such that said plasma includes ions of a coating material;

flowing said plasma from said source to an entrance end of said internal passageway of said workpiece;

exhausting said plasma from an exit end of said internal passageway; and establishing a hollow cathode effect upon said plasma between said entrance and exit ends so as to increase ionization of said plasma that is within said workpiece, including applying a bias and a pressure to achieve said increase in ionization.

14. The method of claim 13 wherein applying said pressure includes maintaining a relationship between said pressure and a diameter of said internal passageway, such that oscillation of electrons of said plasma is induced.

15. The method of claim 14 wherein applying said bias includes connecting a negative voltage to said workpiece, said workpiece being conductive.

16. The method of claim 15 wherein applying said bias includes pulsing said negative voltage.

* * * * *